United States Patent
Six et al.

(10) Patent No.: US 8,279,402 B2
(45) Date of Patent: Oct. 2, 2012

(54) OPTICAL ARRANGEMENT FOR IMMERSION LITHOGRAPHY WITH A HYDROPHOBIC COATING, AS WELL AS PROJECTION EXPOSURE APPARATUS COMPRISING THE SAME

(75) Inventors: Stephan Six, Aalen (DE); Michael Lill, Kaiserslautern (DE); Ruediger Duesing, Neu-Ulm (DE); Bernhard Gellrich, Aalen (DE); Michael Widmann, Aalen (DE); Andreas Schubert, Limbach-Oberfrohna (DE); Tilmann Von Papen, Aalen (DE); Thomas Ihl, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 593 days.

(21) Appl. No.: 12/403,132

(22) Filed: Mar. 12, 2009

(65) Prior Publication Data

US 2009/0233233 A1    Sep. 17, 2009

Related U.S. Application Data

(63) Continuation of application No. PCT/EP2007/007932, filed on Sep. 12, 2007.

(60) Provisional application No. 60/877,743, filed on Dec. 29, 2006.

(30) Foreign Application Priority Data

Sep. 12, 2006 (DE) .......................... 10 2006 043 548
Dec. 28, 2006 (DE) .......................... 10 2006 062 480

(51) Int. Cl.
   *G03F 7/207*    (2006.01)

(52) U.S. Cl. ......................................................... 355/67
(58) Field of Classification Search .................... 355/53, 355/67, 55
   See application file for complete search history.

(56) References Cited

U.S. PATENT DOCUMENTS

| | | |
|---|---|---|
| 4,320,936 A | 3/1982 | Sawamura |
| 4,741,619 A | 5/1988 | Humphries et al. |
| 4,958,563 A | 9/1990 | Lewis et al. |
| 5,494,712 A | 2/1996 | Hu et al. |
| 6,097,536 A | 8/2000 | Bauer et al. |

(Continued)

FOREIGN PATENT DOCUMENTS

DE    100 47 007 C    4/2002

(Continued)

OTHER PUBLICATIONS

Liberman et al., "Long-Term 193-nm Laser Irradiation of Thin-film-Coated CaF2 in the Presence of H20", Optical Microlithography XVII, ed. Bruce Smith, Proceedings of SPIE vol. 5754 (2005), XP-002431838, pp. 646-654.

(Continued)

*Primary Examiner* — Glen Kao
(74) *Attorney, Agent, or Firm* — Fish & Richardson P.C.

(57) ABSTRACT

An optical arrangement for immersion lithography, having at least one component (1) to which a hydrophobic coating (6, 7) is applied, the hydrophobic coating (6, 7) being exposed to UV radiation during operation of a projection lens, and the at least one component (1) being wetted at least in part by an immersion fluid during operation of the projection lens. The hydrophobic coating (6, 7) includes at least one UV-resistant layer (6) that absorbs and/or reflects UV radiation at a wavelength of less than 260 nm.

27 Claims, 3 Drawing Sheets

U.S. PATENT DOCUMENTS

| | | |
|---|---|---|
| 7,215,410 B2 | 5/2007 | Sumiyoshi |
| 7,408,652 B2 | 8/2008 | Wegmann et al. |
| 7,697,111 B2 | 4/2010 | Shirai et al. |
| 7,993,008 B2 | 8/2011 | Shirai et al. |
| 2005/0100745 A1 | 5/2005 | Lin et al. |
| 2005/0175776 A1 | 8/2005 | Streefkerk et al. |
| 2005/0225737 A1 | 10/2005 | Weissenrieder et al. |
| 2005/0243325 A1 | 11/2005 | Rapp et al. |
| 2005/0243328 A1* | 11/2005 | Wegmann et al. ............ 356/520 |
| 2006/0097205 A1 | 5/2006 | Kakuchi et al. |
| 2006/0103817 A1 | 5/2006 | Ten Kate et al. |
| 2006/0132736 A1 | 6/2006 | Nagasaka et al. |
| 2006/0176456 A1 | 8/2006 | Nagasaka et al. |
| 2006/0240365 A1 | 10/2006 | Lipson et al. |
| 2006/0291060 A1* | 12/2006 | Shirai et al. ................. 359/582 |
| 2007/0004182 A1 | 1/2007 | Chang et al. |
| 2007/0188879 A1 | 8/2007 | Ikezawa et al. |
| 2007/0201011 A1* | 8/2007 | Kokubun et al. ................ 355/53 |
| 2009/0103070 A1 | 4/2009 | Shirai et al. |
| 2010/0220305 A1 | 9/2010 | Shirai et al. |

FOREIGN PATENT DOCUMENTS

| | | |
|---|---|---|
| DE | 101 36 620 A1 | 2/2003 |
| DE | 102 61 775 A1 | 7/2004 |
| DE | 10 2004 059 778 A1 | 8/2005 |
| DE | 10 2006 029 720 A1 | 6/2007 |
| EP | 0895113 A2 | 2/1999 |
| EP | 1 670 038 A | 6/2006 |
| EP | 1 760 528 A2 | 3/2007 |
| JP | 11149812 A | 6/1999 |
| JP | 2003161806 A | 6/2003 |
| JP | 2005268759 A | 9/2005 |
| JP | 2005-286026 | 10/2005 |
| JP | 2006-178327 | 7/2006 |
| JP | 2007-96254 | 4/2007 |
| WO | WO 2005/020298 | 3/2005 |
| WO | WO 2005020298 A1 * | 3/2005 |
| WO | 2006133884 A2 | 12/2006 |

OTHER PUBLICATIONS

English translation of Japanese Office Action, for corresponding JP Appl No. 2009-527067, dated Feb. 21, 2012.

English translation of Korean Office Action for corresponding KR Appl No. 10-2008-7030917, dated Dec. 12, 2011.

* cited by examiner

OPTICAL ARRANGEMENT FOR IMMERSION LITHOGRAPHY WITH A HYDROPHOBIC COATING, AS WELL AS PROJECTION EXPOSURE APPARATUS COMPRISING THE SAME

CROSS-REFERENCE TO RELATED APPLICATIONS

This application is a Continuation of International Application PCT/EP2007/007932, with an international filing date of Sep. 12, 2007, which was published under PCT Article 21(2) in English, and the complete disclosure of which, including amendments, is incorporated into this application by reference. This application claims the benefit under 35 U.S.C. 119(e)(1) of U.S. Provisional Application No. 60/877, 743, filed Dec. 29, 2006. The disclosure of U.S. Provisional Application No. 60/877,743 is considered part of and is hereby incorporated by reference into the present application. This application further claims priority under 35 U.S.C. 119 (a) to German Patent Application No. 10 2006 062 480.7 filed on Dec. 28, 2006, and to German Patent Application No. 10 2006 043 548.6, filed on Sep. 12, 2006. The entire contents of both of these applications are hereby incorporated by reference into the present application.

BACKGROUND TO THE INVENTION

The invention relates to an optical arrangement for immersion lithography, having at least one component to which a hydrophobic coating is applied, the hydrophobic coating being exposed to UV radiation during operation of a projection lens, the at least one component being wetted at least in part by an immersion fluid during operation of the projection lens. The invention further relates to a projection exposure apparatus including such an optical arrangement.

As a rule, wetting of optical components with liquids, in particular with water, has a negative effect on their optical characteristics. Wetting can, for example, result in the formation of contaminating substances such as salts on their surfaces. In order to prevent wetting of optical elements with water, or in order to quickly remove water from said optical elements, it has been known to provide optical elements with hydrophobic coatings. In the context of this application the term "hydrophobic coating", as is generally the case, refers to a coating whose surface encloses a contact angle of 90° or above with water.

JP 2003-161806 A describes an optical element with an anti-reflection coating in which a water-repellent layer is formed in a non-coated region of the glass substrate. In this arrangement the water-repellent coating can be formed adjacent to the anti-reflection coating or on a lateral edge of the glass substrate. In this way any lodging of humidity in the space between the optical element and an associated holding structure is to be prevented.

U.S. Pat. No. 5,494,712 describes a method for applying a layer of a polymer to a substrate to reduce its wetting by water. The layer preferably includes one or several organo-silicon compounds, e.g. silanes or siloxanes, and is applied using plasma enhanced chemical vapour deposition (PECVD).

The issue of wetting is significant also in microlithography, in particular in immersion lithography. In microlithography, for the purpose of producing semiconductor components, structures on a mask are imaged with a projection lens at a reduced scale onto a light-sensitive substrate. In order to achieve the high resolution required for such applications, illumination radiation in the UV wavelength range, typically below 250 nm is used. In order to achieve a further increase in resolution and depth of field, in immersion lithography, an immersion fluid, usually distilled water, is arranged between the last optical element of the projection lens and the light-sensitive substrate so as to increase the refractive index. In this arrangement the last optical element of the projection lens is at least partly wetted by water, so that in immersion lithography water-repellent and water-resistant coatings are used with increased frequency.

From JP 2005-268759 A an optical component has become known, which is arranged in a projection exposure apparatus for immersion lithography and at least on one surface is exposed to the illumination radiation. The surface has a bonding layer made of silicon dioxide ($SiO_2$), magnesium fluoride ($MgF_2$) or calcium fluoride ($CaF_2$), onto which a water-repellent layer including an amorphous fluoropolymer has been applied.

JP11-149812 describes an optical element to which a water-repellent protective layer, preferably including a fluorocarbon polymer, has been applied to a reflection-increasing or a reflection-reducing multilayer system, so as to provide protection against the ingress of humidity from the ambient air. The thickness of the protective layer is between 1 nm and 10 nm so as to prevent excessive absorption of radiation by the fluorocarbon polymer at wavelengths of less than 250 nm.

EP 0895113 A2 describes an assembly having a holding device and a component pasted up with an adhesive, which component transmits radiation in the ultraviolet spectral range. The adhesive is curable by UV light, and between the transparent component and the adhesive, in the region of the adhesive, a thin layer is applied which transmits light in a spectral range suitable for curing the adhesive, and which reflects or absorbs to a high degree UV light from a useful spectral range within the spectral range transmitted by the transparent component, as a result of which the adhesive is protected against UV radiation in this wavelength range.

From printed publication US 2006/0240365 a method for protecting a water-sensitive lens element has become known. In this method, at an edge region of the lens surface a thin UV-resistant layer that absorbs UV radiation is generated, which layer consists of a metal oxide. A further protective layer is applied to the metal oxide layer, which further layer can, for example, be a polyurethane layer. The two layers are intended to protect the lens element, which can, for example, consist of water-sensitive calcium fluoride, from being dissolved by an immersion fluid.

However, hydrophobic coatings can not only be used, as described above, for the purpose of preventing the wetting of optical surfaces. Instead, hydrophobic coatings can also be applied to a location on a component, at which location wetting by water is inevitable, e.g. in order to produce an essentially meniscal water column. Applying such a coating can be advantageous, e.g. in the case of interferometric measuring of a projection lens for microlithography, with respect to its optical imaging properties and to any imaging errors, prior to the use of said lens. For such measuring, the projection lens is arranged above a corresponding measuring device, and an immersion fluid is placed between the measuring device and the projection lens so that measuring can take place at conditions experienced in practical application. In most cases super-pure water is used as an immersion fluid, with a ring around the optical components of the measuring device preventing said super-pure water from running off. This ring must have a hydrophobic surface in order to produce a convex and thus upwardly curved water meniscus. It is important that impeccable contact to the last optical component of the lens, which component faces the measuring device, is reliably ensured at all times.

A general problem in the use of hydrophobic coatings in immersion systems consists of the possibility of said coatings being damaged or destroyed by the UV radiation that during operation of the projection lens impinges on said coatings. Furthermore, as a result of UV radiation the hydrophobic characteristics of the coating may degrade so that in extreme cases said coating can develop hydrophilic characteristics. In particular, practical applications have shown that the hitherto-used materials in the construction of the ring with the hydrophobic surface have already changed after a short time, as far as their surface characteristics are concerned, to the effect that with increased duration of radiation there was a reduction in their hydrophobic characteristics. This relates in particular to radiation with lasers which use increasingly shorter wavelengths, e.g. at a wavelength of 193 nm and shorter. This means that already after a brief period of operation it was no longer possible to provide a stable convex water meniscus, and as a result of this the immersion column between the lens and the measuring device broke, with measuring having to be interrupted.

OBJECT OF THE INVENTION

It is an object of the invention, in an optical arrangement of the type mentioned in the introduction, to provide a component with a hydrophobic coating that maintains its hydrophobic characteristics even under intensive and enduring UV radiation.

SUMMARY OF THE INVENTION

This object is addressed in that the hydrophobic coating includes at least one UV-resistant layer that absorbs and/or reflects UV radiation at a wavelength of less than 260 nm. In this arrangement the hydrophobic coating can, for example, includes only a single UV-resistant, absorbent and/or reflective layer which additionally has hydrophobic characteristics, or the UV-resistant absorbent and/or reflective layer can protect a further, hydrophobic, layer of the coating from the UV radiation of the projection lens.

In an advantageous embodiment the component is an optical element made from a material that is transparent at wavelengths in the UV range, which optical element preferably forms an end element of the projection lens. In this case the optical element is wetted, at least in a partial region, by the immersion fluid, with the hydrophobic coating in this arrangement typically having been applied to the surface of the optical element outside this partial region so as to protect against wetting a further part of the optical element, which part as a rule is directly adjacent to the wetted partial region, and which part does not dip into the immersion fluid.

In a preferred improvement the hydrophobic coating is formed outside the optically clear diameter of the optical element. The term "optically clear diameter" of an optical element refers to that region through which radiation passes in a targeted manner, i.e. that region which, e.g. in the case of a lens, contributes to the imaging. The optically clear diameter can, in particular, be determined by the region of the surface, at which region the lens surface has been polished, whereas the region outside this diameter has an unpolished, matte and thus rough surface. Usually, the region within the optically clear diameter essentially corresponds to the region in which an end element of the projection lens dips into the immersion fluid.

The inventors have recognised that even any wetting of the optical element outside the optically clear diameter can have a negative effect on its optical characteristics, namely as a result of cold due to evaporation resulting from the wetting. Consequently, in the wetted region a heat sink is generated, which can have a negative effect on the temperature equilibrium of the optical element, and which, for example in the case of lenses as optical elements, can result in undesirable imaging errors. This problem occurs in particular on matte surfaces, i.e. in particular outside the optically clear diameter, because liquid does not run off as well from matte surfaces as it does from polished surfaces.

Furthermore, the inventors have recognised that even outside the clear optical diameter the hydrophobic coating can be damaged as a result of UV radiation, namely as a result of scattered light arising in the optical element when the projection lens is operated; which is why the hydrophobic coating has at least one UV-resistant layer. In this arrangement, the hydrophobic coating can either have only a single UV-resistant hydrophobic layer, or, preferably, by using a UV-resistant layer that absorbs UV light, a further hydrophobic layer can be protected from UV radiation from the interior of the optical element.

In an advantageous improvement a reflection-reducing coating is applied to the optical element, wherein the hydrophobic coating is arranged in a non-coated region of the optical element, preferably adjacent to the reflection-reducing coating. As a rule, the anti-reflection coating is applied at least in the region of the clear optical diameter of a lens; the anti-reflection coating usually has several layers in which materials of high and of low refractive index alternate. Preferred examples of anti-reflection coatings are stated in PCT/EP2006/005630 of the applicant, which publication, as a result of the reference to it, is made part of the content of this application.

In a particularly preferred improvement a hydrophobic layer is applied on top of the UV-resistant layer. As already set out above, the layer that is UV resistant and that absorbs UV radiation protects the hydrophobic layer from UV radiation. In this way degradation (relating to the contact angle with water, the coating adherence and the leaching behaviour) of the hydrophobic layer can be prevented.

In an advantageous improvement the material of the hydrophobic layer is selected from the group consisting of: chromium dioxide ($CrO_2$), silanes, siloxanes, DLC, fluorides, hydrophobic varnishes and adhesives, polymers, preferably fluorocarbon polymers, in particular Optron, WR1 and Teflon AF. Optron is a type of coating made by Merck; Teflon AF is distributed by Cytop. The siloxanes can be cured with UV light or they can be thermally cured (e.g. Ormocer) or they can be applied using a CVD-method. None of the above-mentioned materials are stable in the long term when they are exposed to UV light at radiation intensities that are common in microlithography, at least when the hydrophobic layer is used in an air atmosphere containing oxygen. In this context the term "stable in the long term" refers to a service life of typically seven years or less. In addition, in several of the above-mentioned materials, substrate adhesion and the hydrophobic characteristics can be impeded by exposure to the UV light. However, it may be possible to increase the long-term stability of these materials by providing an inert gas atmosphere, e.g. $N_2$, a noble gas or mixtures of these. Further materials suitable for the hydrophobic layer include fluoresins, fluorine-based resin materials such as polytetrafluoro-ethylene, an acrylic resin material, or a silicon-based resin material. CYTOP (manufactured by ASAHI GLASS CO., LTD.) may be used as a water-repellent layer as well.

In a further preferred improvement the transparent material is selected from the group including: calcium fluoride ($CaF_2$), quartz glass ($SiO_2$) and germanium dioxide ($GeO_2$). In particular calcium fluoride and quartz glass are typical lens materials used in microlithography.

In an improvement the UV-resistant layer is transparent to radiation at a wavelength of 900 nm or above. The UV-resistant layer is thus permeable to wavelengths at which it has to be radiated in the process chain, i.e. for example at 940 nm for laser soldering, or above 1 μm for pyrometer measurements.

In a preferred improvement the optical element is designed as a plano-convex lens, wherein the planar surface includes a conically shaped lens part. An optical element shaped in this manner is preferably used as an end element of the projection lens for immersion lithography.

In a further preferred embodiment the hydrophobic coating is provided on the conical lateral surface of the conically shaped lens part and/or on the planar surface. Since the conically shaped lens part is at least in part in contact with the immersion fluid, in particular in the case of a conical lateral surface there is a danger of the conical lateral surface being wetted by the immersion fluid, wherein wetting can extend from that location to the planar surface. Through use of the hydrophobic coating, wetting and thus dropping of the temperature of the optical element in this region can be prevented. In addition or as an alternative, the hydrophobic coating can also be applied to an edge region, e.g. a lateral surface, of the lens, on which edge region the lens is connected to a holder: In this way any ingress of water into a gap between the lens and the mount can be prevented.

In a further advantageous improvement at least a front face of the conically formed lens part of the optical element dips into the immersion fluid, as a result of which the numerical aperture of the projection lens and thus the imaging of smallest structures becomes possible at high resolution and with great depth of field.

In a highly preferred embodiment of the invention, the optical arrangement has an optical measuring device for determining the optical characteristics of the projection lens, wherein between the projection lens and the optical measuring device an immersion fluid is arranged, and wherein in the region of the immersion fluid a component is arranged which for the purpose of forming an essentially meniscal water column includes the hydrophobic coating. As is set out in the introduction, the hydrophobic coating in this case is not used to prevent wetting of the component with water, but instead to generate a convex upwardly curved water meniscus. The optical arrangement with the measuring device does not necessarily form part of a projection exposure apparatus, but may be used as a stand-alone measuring arrangement used for characterizing the optical performance of projection lenses during the manufacturing process of different projection exposure apparatuses.

In an advantageous improvement of this embodiment the component having the hydrophobic coating forms part of the housing of the measuring device or is a component of the measuring device, which component is connected to said measuring device, above which component the immersion fluid is located.

In a further advantageous improvement the component having the hydrophobic coating includes an enclosure ring for limiting the immersion fluid so that the immersion fluid is prevented from running off.

In a further advantageous improvement the component having the hydrophobic coating is made from precious metal. Other materials are also possible for this.

If the lens to be measured is, for example, a lens that is already in use, wherein below the lens a wafer is arranged, the component to be coated can also be made of Zerodur, quartz or a similar material that is used in projection exposure apparatus.

In a preferred embodiment, water, in particular super-pure water, is provided as an immersion fluid. Apart from the use of water, other immersion fluids, such as e.g. oils, are also possible.

Even during operation of such a lens, now and then energy measurements, transmission measurements and the like have to be carried out, so that for this reason various measuring devices are arranged around the wafer. In this arrangement, too, it is necessary for close liquid contact to be present between the last optical element of the lens and the measuring device. Therefore in this arrangement, too, a component needs to be provided that ensures the formation of a convex water meniscus which remains in place even during intensive radiation at conditions experienced in practical applications.

In a further preferred embodiment the UV-resistant layer is impermeable to UV radiation at a wavelength of below 260 nm, preferably below 200 nm. Normally, due to the available light sources, the wavelength of UV radiation used in immersion exposure equipment is 248 nm or 193 nm. The absorption edge of the UV-resistant layer is thus above the operational wavelength of the exposure apparatus, as a result of which a layer that is applied on top of this layer and that is not completely UV resistant and is hydrophobic can be protected from this radiation. Furthermore, the impermeable layer, when applied to an optical element, also provides protection against UV radiation during the so-called "UV burning" of the opposite lens surface, which lens surface is subjected to intensive UV radiation during this cleaning method so as to remove any adsorbed impurities. In the process chain for providing the optical element, UV-burning is provided in various coating-, measuring- and installation steps. Due to the provision of the hydrophobic layer the absorbent layer can be applied already at a very early point in time in the process chain.

The UV-resistant layer preferably includes a material that is selected from the group consisting of: titanium dioxide ($TiO_2$), tantalum pentoxide ($Ta_2O_5$), hafnium dioxide ($HfO_2$), zirconium dioxide ($ZrO_2$) and titanium-zirconium mixed oxides, which can particularly advantageously be used for coating a component including quartz glass, calcium fluoride or germanium dioxide. In particular $TiO_2$ and $Ta_2O_5$ are suitable as materials for the UV-resistant layer because they are highly absorbent at wavelengths below 280 nm and even show hydrophobic characteristics that are at least better than those of quartz glass, so that partial damage of a hydrophobic layer applied on top of it does not have too negative an effect on the optical characteristics of the optical element. If need be the hydrophobic coating can also have only a layer of one of the above-mentioned materials. Furthermore, the above-mentioned materials can be used as bonding agents for the hydrophobic coating, i.e. the hydrophobic layer adheres better to these materials than it does to the substrate of the component. Further metal oxides with an optical density not less than 1 which are suitable for the UV-resistant layer are e.g. SiO or $Cr_2O_3$. It is understood that mixtures of the materials described above may be used for forming the UV-resistant layer as well.

In a further preferred embodiment the UV-resistant layer measures at least 200 nm in thickness. With such a thickness, with most of the absorbent materials it is ensured that the UV radiation will not penetrate the absorbent layer. However, to prevent detachment of the layer, the thickness of the absorbent layer should not be excessive. In the case of $Ta_2O_5$ and $TiO_2$ as layer materials, a maximum layer thickness of 1 μm should not be exceeded.

In a further advantageous embodiment the UV-resistant layer is a precious-metal layer.

Extensive trials have shown that a precious metal coat, e.g. including gold, iridium, palladium, platinum, mercury, osmium, rhenium, rhodium, ruthenium, silver, cobalt, copper or their alloys maintains its hydrophobic surface characteristics even after extended and intensive irradiation.

A second solution for a hydrophobic coating that is also very resistant consists of the use of a metal layer of the third to seventh group in the periodic system of the chemical elements, e.g. chromium, molybdenum, tungsten, vanadium, niobium, tantalum, titanium, zirconium, hafnium, scandium, yttrium, manganese, thallium, and their alloys. It is understood that other metals with an optical density of not less than 1, such as silicon (Si), may be used as well.

When using the precious metal or metal layer according to the invention it has been shown that there is no contamination of the immersion fluid as a result of substances emanating from the coating under the described aggravated conditions based on short-wave laser irradiation.

In practical applications, a coating including chromium oxide, also known as black chromium, has been shown to be particularly suitable. Black chromium is a compound including chromium dioxide and metallic chromium and exhibits durability under exposure to UV radiation which is sufficient for microlithography applications, in particular when the coating is arranged in an immersion liquid.

Furthermore, layer thicknesses of the UV-resistant precious metal or metal layer of between 10 and 200 nm, preferably of between 15 and 100 nm have been shown to be particularly advantageous.

Preferably, the UV-resistant layer and/or the hydrophobic layer are/is applied by a method selected from the group consisting of: sputtering, PVD (physical vapour deposition), CVD (chemical vapour deposition), PECVD (plasma-enhanced CVD), cold-gas spraying, spin coating, plasma spraying, dip coating and manual coating, in particular application with the use of a brush or a sponge. Sputtering, also known as cathodic sputtering, is a method for the precipitation of a layer, with which method a high quality of the layer to be applied can be achieved with a very thin layer thickness. The three subsequently mentioned methods relate to techniques for coating substrates by vapour deposition on the surfaces to be coated. In the case of cold-gas spraying, the coating material is applied to the base material in powder form at very high speed. In the case of rotary coating, thin and homogeneous layer are applied to, or spun onto, a rotating substrate. In the case of plasma spraying, a powder is added to the plasma jet, which powder is melted on as a result of the high plasma temperature, and is thrown with the plasma jet onto the work piece to be coated. Dip coating makes it possible to apply the coating homogeneously. Finally, application with the use of a brush or sponge provides options of manual coating.

The invention is further implemented in a projection exposure apparatus for immersion lithography having an illumination system, a projection lens, as well as an optical arrangement as described above. The optical arrangement can include an optical element as an end element of the projection lens with a hydrophobic coating, and/or it can include a component that for the purpose of producing an essentially meniscal water column has a hydrophobic coating.

Further characteristics and advantages of the invention are set out in the following description of exemplary embodiments of the invention, in the figures of the drawing that show details that are significant in the context of the invention, and in the claims. Individual characteristics can be implemented individually per se or several together in any combination in a variant of the invention.

BRIEF DESCRIPTION OF THE DRAWINGS

Exemplary embodiments are shown in the diagrammatic drawing and are explained in the following description. The following are shown.

DETAILED DESCRIPTION OF PREFERRED EMBODIMENTS

Figure 1A:
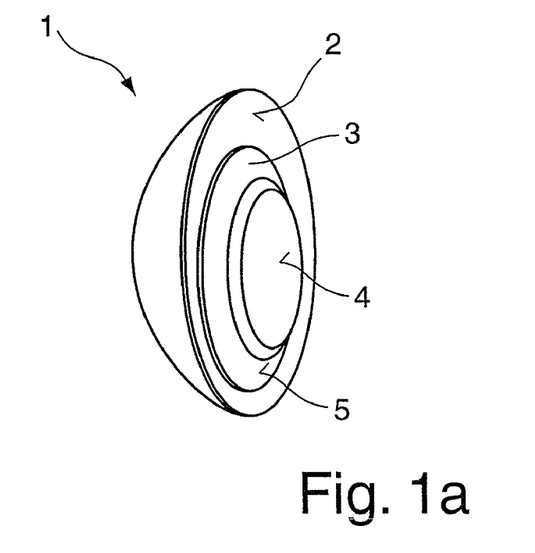
FIGS. 1a, b diagrammatic views of an optical element with a hydrophobic coating, (a) in a perspective view, and (b) in a section view.

FIGS. 1a, b diagrammatically shows an optical element 1 that comprises quartz glass ($SiO_2$), is designed as a piano-convex lens, and on a planar surface 2 includes a conical lens part 3 in the form of a truncated cone. The conical lens part 3 has two sub-regions with different aperture angles and includes a face 4 onto which an anti-reflection coating 9 (shown in FIG. 1b) has been applied. In order to provide protection against degradation by water, this anti-reflection coating 9 includes an uppermost layer, known as a capping layer, for example made of $SiO_2$ or Teflon (not shown). Furthermore, if need be, a hydrophobic coating can also be formed on the anti-reflection coating, wherein in this case a UV-resistant coating has to be selected that at the same time is transparent to UV radiation at the operating wavelength. During operation only that part of the UV radiation is used to contribute to imaging, which part enters through the face 4 so that the diameter of said face 4 approximately determines the clear optical diameter. It is understood that in particular with the use of the optical element 1 in immersion lithography it may be possible to do without an anti-reflection coating 9.

On the conical lateral surface 5 of the conical lens part 3, adjacent to the anti-reflection coating a hydrophobic coating 6, 7 (shown in FIG. 1b) is applied, which extends further over the planar lens surface 2 and which includes a first layer 6 made of $TiO_2$ that is UV resistant and that absorbs UV light with a wavelength of less than 280 nm. As an alternative, the first layer 6 can also include other materials, for example $Ta_2O_5$, $HfO_2$, $ZrO_2$ or mixed oxides including titanium-zircon. In addition to the region shown, the lens can also have a hydrophobic coating on a lens edge, e.g. on a cylindrical lateral surface. In this way it is possible to prevent any ingress of water into the gap between the lens and the mount, which gap arises when the optical element 1 is installed.

Figure 1B:
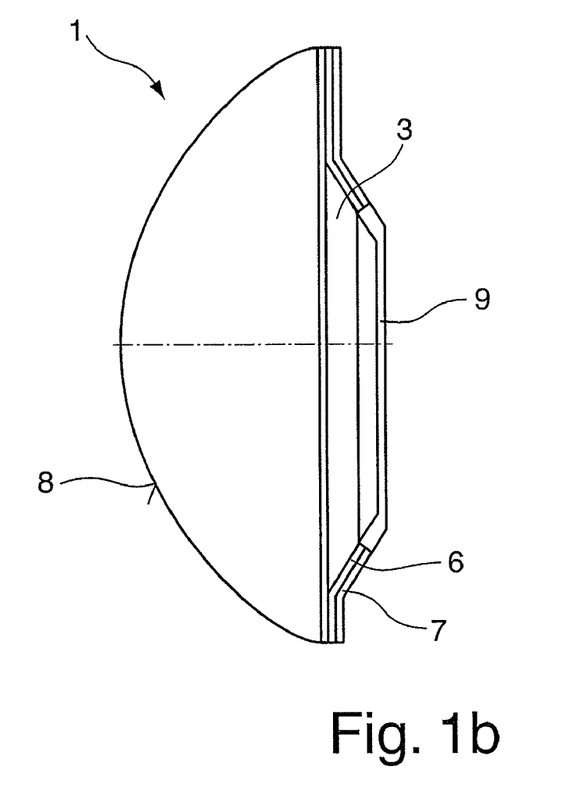

A hydrophobic second layer 7 is applied onto the first layer 6, which second layer 7 consists of a fluorocarbon polymer, in the present case Optron. The second layer 7 is not resistant to UV radiation and can thus be damaged by scattered light that enters through the lateral surface 5 of the conical lens part 3 or through the planar surface 4. In order to protect the second layer 7 from the scattered light, the first layer 6 has a thickness of more than 200 nm, which is sufficient to render it impermeable to UV light. The second layer 7 can also be made from some other hydrophobic and non-UV-resistant material, for example from chromium dioxide ($CrO_2$), silanes, siloxanes, polymers, fluoropolymers such as WR1 or Teflon AF, DLC, fluorides or a hydrophobic varnish or adhesive. The first layer 6 additionally serves as a bonding agent for the second layer 7 and for this reason has a lattice structure that is comparable to that of the second layer 7.

In the process chain for preparing the optical element 1 for installation in an optical apparatus, the hydrophobic coating 6, 7 is applied at an early stage. In this process the second layer 7 is protected by the first layer 6 against UV radiation passing through the lens, which UV radiation is used during UV-burning of the convex lens surface 8, e.g. during a subsequent coating step in the process chain. The first layer 6 of $TiO_2$ is transparent above 900 nm so that it is possible to also carry out steps in the process chain in which steps the optical element 1 needs to be transilluminated by radiation, for example during laser soldering.

Other suitable combinations of layer materials for the second and first layers 7, 6 include (layer thicknesses are given in brackets): fluoresin (1.0 μm)/Si (200 nm), fluoresin (1.0 μm)/Ta (200 nm), fluoresin (0.5 μm)/$Cr_2O_3$ (50 nm)/Cr (150 nm), fluoresin (0.5 μm)/W (100 nm)/Cr (1.00 nm) etc. In any of these combinations, it is possible to provide an optical density of not less than one.

Coating the optical element 1 with the hydrophobic coating 6, 7 is carried out with the use of a CVD technique. It is understood that as an alternative to this, other coating techniques such as PVD, PECVD, cold-gas spraying, spin coating, plasma spraying, dip coating and manual coating, in particular application with the use of a brush or a sponge, can also be used.

Furthermore, instead of using the coating 6, 7 which has a first layer 6 and a second layer 7, it is also possible to use coatings with more or with fewer layers. If need be, more than two layers can be applied, and a further functional layer may be provided between the first and second layers 6, 7 and/or between the surfaces 5, 2 and the first layer 6, respectively. The functional layer may be a protective layer, a layer to improve the tight contact performance between the first layer 6 and the second layer 7, or a layer to reinforce the mechanical strength. However, it may also be sufficient to apply only a single layer of a UV-resistant material, for example of $TiO_2$ or $Ta_2O_5$, because these materials in comparison to quartz glass have better hydrophobic characteristics and thus already offer some protection against wetting.

In particular, the coating can also be a UV-resistant layer made from a precious metal, e.g. gold, iridium, palladium, platinum, mercury, osmium, rhenium, rhodium, ruthenium, silver, cobalt, copper and their alloys, or from a metal of the third to seventh group in the periodic system of the chemical elements, e.g. chromium, molybdenum, tungsten, vanadium, niobium, tantalum, titanium, zirconium, hafnium, scandium, yttrium, manganese, thallium, and their alloys. It has been shown that these materials are particularly resistant to UV radiation, and that they do not contaminate the immersion fluid with substances emanating from the coating. In this arrangement a coating having only a single such layer can be used, as can a coating in which a hydrophobic layer is protected from UV radiation by way of the metal layer or precious metal layer. It is understood that, as set out above, in order to improve adhesion the coating can also include several layers of a precious metal or of a metal of the third to seventh main group.

Figure 2:
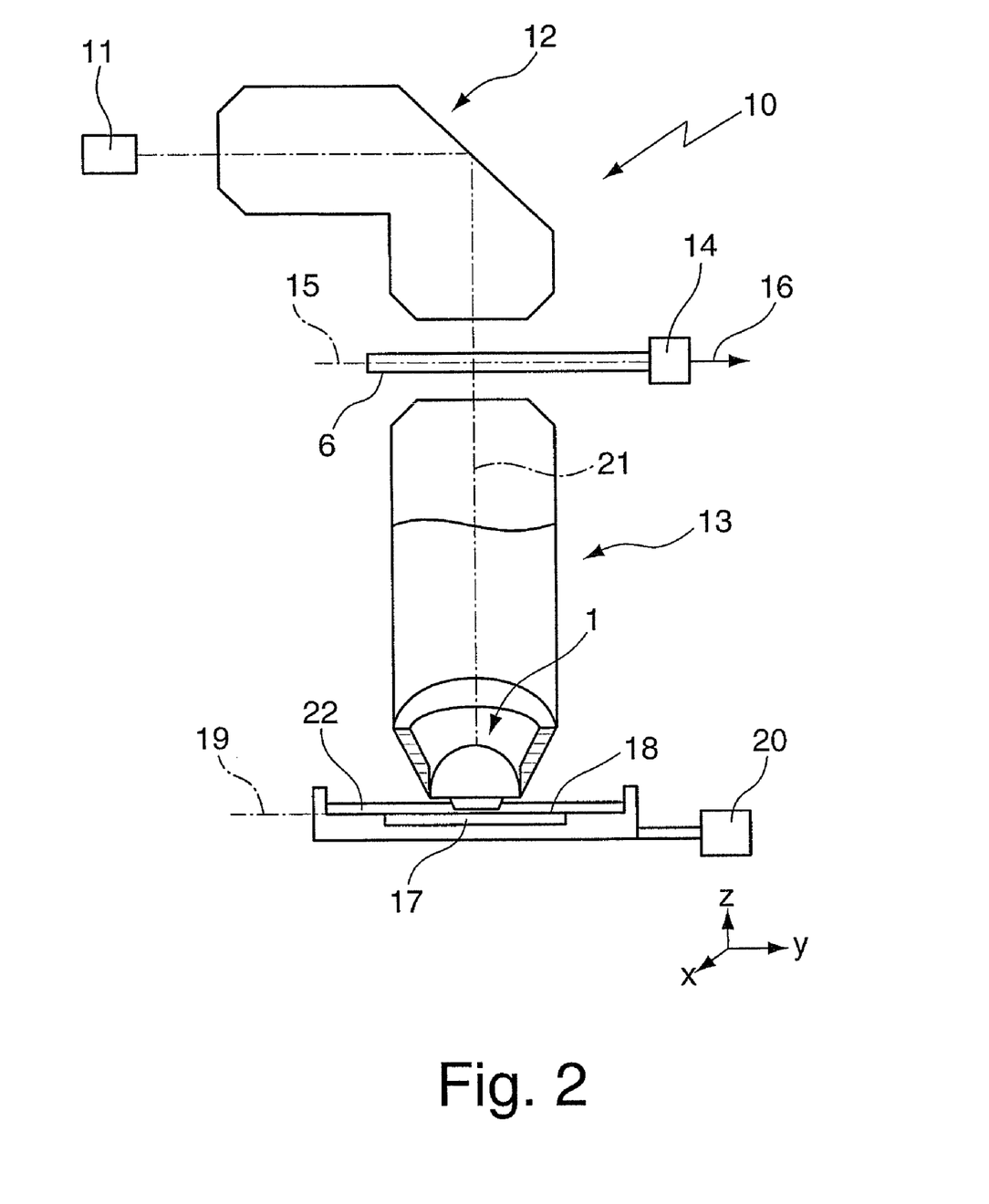
FIG. 2 a diagrammatic view of an embodiment of a projection exposure apparatus for microlithography with the optical element according to FIGS. 1a, b as an end element of a projection lens.

The function of the optical element 1 is expediently described in the context of the exposure operation of a projection exposure apparatus 10 for micro-lithography, as shown in FIG. 2 in the form of a wafer scanner for producing highly integrated semiconductor components.

The projection exposure equipment 10 has as a light source an excimer-laser 11 with an operating wavelength of 193 nm, wherein other operating wavelengths, for example 248 nm, are also possible. An illumination system 12, arranged downstream, produces in its exit plane a large, sharply defined, very homogeneously illuminated image field that matches the telecentric requirements of a projection lens 13 arranged downstream.

Behind the illumination system 12 a device 14 for holding and manipulating a photo mask (not shown) is arranged such that said photo mask is situated in the object plane 15 of the projection lens 13, and, for scanning operation, can be moved in this plane in a direction of travel indicated by an arrow 16.

Behind the plane 15, which is also referred to as the mask plane, the projection lens 13 follows, which images an image of the photo mask at a reduced scale, for example at a scale of 4:1 or 5:1 or 10:1, to a wafer 17 to which a photoresist layer has been applied. The wafer 17, which serves as a light-sensitive substrate, is arranged such that the plane substrate surface 18 with the photoresist layer essentially coincides with the image plane 19 of the projection lens 13. The wafer 17 is held by a device 20 that has a scanner drive in order to move the wafer 17 synchronously in relation to the photo mask and anti-parallel to said photo mask. The device 20 also includes manipulators in order to move the wafer 17 not only in the z-direction parallel to an optical axis 21 of the projection lens 13, but also in the x- and y-directions perpendicularly in relation to said axis.

The projection lens 13 includes the optical element 1 of FIGS. 1a, b as the end element adjacent to the image plane 19, i.e. a transparent piano-convex lens with a conical lens part 3 whose face 4 forms the last optical surface of the projection lens 13 and which is arranged at a working distance above the substrate surface 18. Between the face 4 and the substrate surface 18 water is arranged as an immersion fluid 22, which increases the numeric aperture, on the output end, of the projection lens 13. Consequently, imaging of structures on the photo mask can take place at greater resolution and depth of field than is possible when the space between the optical element 1 and the wafer 17 is filled with a medium of a smaller refractive index, e.g. with air.

Figure 3:
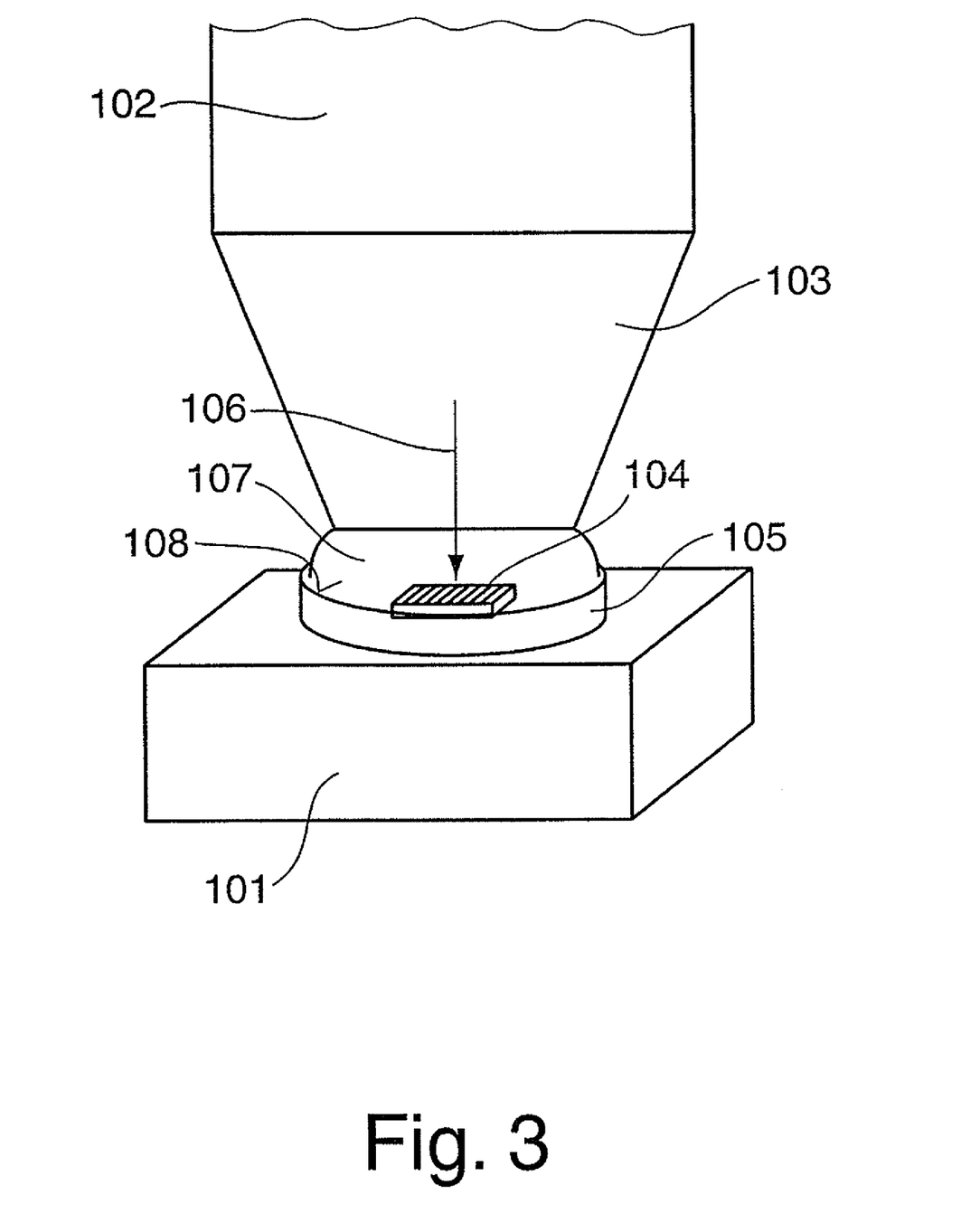
FIG. 3 a diagrammatic view of an embodiment of an optical arrangement used for measuring a projection lens.

It is understood that it is not only optical elements that can be given a hydrophobic coating in order to protect said elements from wetting outside the clear optical diameter, but that components, too, can be given such a coating, in which permanent contact between the hydrophobic coating and the immersion fluid is intentional, i.e. in an optical arrangement as shown in FIG. 3, in which by way of a measuring device 101, at a small space, a projection lens 102 for semiconductor lithography, which projection lens 102 has to be measured, and which is used in an immersion system, is arranged. The optical element 103, which is arranged last in the propagation direction of radiation through the projection lens 102, is located at short spacing above the measuring device 101.

In or on the measuring device 101 there is a grid 104 as an optical component, which is provided for interference measuring. Around the grid 104, a component 105 in the form of a ring is arranged. At least on the inside facing the grid 104, the ring has a hydrophobic coating 108. The hydrophobic coating is a precious metal layer or metal layer which has been applied to the surface of the ring by sputtering. In the exemplary embodiment chromium oxide is used as the hydrophobic metal coating. In practical application it has been shown that this material is very resistant to irradiation with UV light according to the direction of the arrow 106, and that it maintains its hydrophobic characteristics. In practical applications there was no evidence of any contamination of an immersion fluid, e.g. super-pure water 107, which completely fills the interspace between the last optical element 103 and the measuring device 101.

Measuring of the lens can, for example, be carried out as discontinuous measuring, wherein immersion fluid is placed in the interspace. After the meniscus column has formed, the latter correspondingly remains stable for hours, and the desired measurements can be performed. If super-pure water is used, operation is preferably at atmospheric pressure at a water temperature of 20°.

However, it is also possible, instead of a discontinuous method, to continuously pump water at a flow rate of, e.g., a few mm/min through the interspace. In this case too a stable meniscus column is formed.

Generally speaking, during the measurements carried out there is a working distance of approximately 2 to 4 mm, preferably 3 mm, from the measuring device 101.

Instead of hydrophobic coating of the inside of the ring as a component 105, or in addition to the above, the hydrophobic coating can also be provided on the top of the housing of the measuring device 101, which top faces the projection lens 102, or to a plate around the grid 104, which plate has been placed on the top of the measuring device 101.

Furthermore, the use of the measuring device or measuring arrangement shown in FIG. 3 in a projection exposure apparatus as shown, for example, in FIG. 2 is possible. In this case the space between the last optical element 1 of the projection lens 13 in the projection exposure equipment 10 of FIG. 2 and the measuring device 101 is filled with water and is used with the previously described component 105 that includes the hydrophobic coating, in order to form a meniscal water column. In this case an optical arrangement is formed in which both the optical element 1 and the component 105 include a UV-resistant hydrophobic coating 6, 7 and 108, respectively.

The above description of the preferred embodiments has been given by way of example. From the disclosure given, those skilled in the art will not only understand the present invention and its attendant advantages, but will also find apparent various changes and modifications to the structures and methods disclosed. The applicant seeks, therefore, to cover all such changes and modifications as fall within the spirit and scope of the invention, as defined by the appended claims, and equivalents thereof.

The invention claimed is:

1. An immersion lithography optical arrangement, comprising:
    a component having an optically clear diameter and an unpolished surface located outside the optically clear diameter;
    a hydrophobic coating applied to the unpolished surface of the component, the hydrophobic coating configured for exposure to UV radiation, and
    an immersion fluid at least partially wetting the component,
    wherein the hydrophobic coating comprises a UV-resistant layer configured to at least one of absorb and reflect UV radiation at a wavelength of less than 260 nm.

2. The optical arrangement according to claim 1, wherein the component is an optical element comprising a material that is transparent at wavelengths in the UV range, and wherein the optical element is an end element of a projection lens.

3. The optical arrangement according to claim 2, further comprising a reflection-reducing coating applied to the optical element, wherein the hydrophobic coating is arranged in a region of the optical element uncoated by the reflection-reducing coating.

4. The optical arrangement according to claim 2, wherein the transparent material is selected from the group consisting of: calcium fluoride ($CaF_2$), quartz glass ($SiO_2$) and germanium dioxide ($GeO_2$).

5. The optical arrangement according to claim 2, wherein the optical element is a plano-convex lens, wherein the planar surface is provided with a conically shaped lens part.

6. The optical arrangement according to claim 5, wherein the hydrophobic coating is provided on at least one of a conical lateral surface of the conically shaped lens part and on the planar surface.

7. The optical arrangement according to claim 5, wherein at least a front face of the conically shaped lens part of the optical element dips into the immersion fluid.

8. The optical arrangement according to claim 2, wherein the immersion fluid is water.

9. The optical arrangement according to claim 1, wherein the hydrophobic coating further comprises a hydrophobic layer applied on the UV-resistant layer.

10. The optical arrangement according to claim 9, wherein a material of the hydrophobic layer is selected from the group consisting of: chromium dioxide ($CrO_2$), silanes, siloxanes, DLC, fluorides, hydrophobic varnishes, hydrophobic adhesives, polymers, and fluorocarbon polymers.

11. The optical arrangement according to claim 1, wherein the UV-resistant layer is transparent to radiation at a wavelength of at least 900 nm.

12. The optical arrangement according to claim 1, wherein the UV-resistant layer is impermeable to UV radiation having a wavelength below 260 nm.

13. The optical arrangement according to claim 1, wherein the UV-resistant layer comprises a material that is selected from the group consisting of: titanium dioxide ($TiO_2$), tantalum pentoxide ($Ta_2O_5$), hafnium dioxide ($HfO_2$), zirconium dioxide ($ZrO_2$) and titanium-zirconium mixed oxides.

14. The optical arrangement according to claim 1, wherein the UV-resistant layer measures at least 200 nm in thickness.

15. The optical arrangement according claim 1, wherein the UV-resistant layer is a precious-metal layer.

16. The optical arrangement according to claim 15, wherein the UV-resistant layer comprises a material selected from the group consisting of: gold, iridium, palladium, platinum, mercury, osmium, rhenium, rhodium, ruthenium, silver, cobalt, copper and alloys thereof.

17. The optical arrangement according to claim 1, wherein the UV-resistant layer is a metal layer of the third to seventh group in the periodic system of the chemical elements.

18. The optical arrangement according to claim 17, wherein the UV-resistant layer comprises a material selected from the group consisting of: chromium, molybdenum, tungsten, vanadium, niobium, tantalum, titanium, zirconium, hafnium, scandium, yttrium, manganese, thallium, and alloys thereof.

19. The optical arrangement according to claim 18, wherein the UV-resistant layer comprises chromium oxide.

20. The optical arrangement according to claim 1, wherein the coating thickness of the UV-resistant layer is between 10 and 200 nm.

21. An immersion lithography projection exposure apparatus, comprising:
    an illumination system,
    a projection lens, and
    an optical arrangement comprising:
        a component having an optically clear diameter and an unpolished surface located outside the optically clear diameter;

a hydrophobic coating applied to the unpolished surface of the component, the hydrophobic coating configured for exposure to UV radiation, and an immersion fluid at least partially wetting the component, wherein the hydrophobic coating comprises a UV-resistant layer configured to at least one of absorb and reflect UV radiation at a wavelength of less than 260 nm.

22. The projection exposure apparatus according to claim 21, further comprising an optical measuring device for determining the optical characteristics of the projection lens, wherein the immersion fluid is arranged between the projection lens and the optical measuring device, wherein the component is arranged adjacent to the immersion fluid and wherein the immersion fluid forms a meniscal water column contacting the hydrophobic coating.

23. The projection exposure apparatus according to claim 22, wherein the component to which the hydrophobic coating is applied forms part of a housing of the measuring device or is a component of the measuring device that is arranged adjacent to the immersion fluid.

24. The projection exposure apparatus according to claim 22, wherein the component to which the hydrophobic coating is applied comprises an enclosure ring for constraining the immersion fluid.

25. The projection exposure apparatus according to claim 22, wherein the component to which the hydrophobic coating is applied is made from precious metal.

26. A method comprising:

applying a hydrophobic coating to an unpolished surface located outside an optically clear diameter of a component of an immersion lithography optical arrangement, wherein the hydrophobic coating comprises a UV-resistant layer configured to at least one of absorb and reflect UV radiation at a wavelength of less than 260 nm; and at least partially wetting the component with an immersion fluid while exposing the hydrophobic coating to UV radiation.

27. The method according to claim 26, wherein:

the hydrophobic coating further comprises a hydrophobic layer applied on the UV-resistant layer, and at least one of the UV-resistant layer and the hydrophobic layer is applied to the component by a method selected from the group consisting of: sputtering, PVD, CVD, PECVD, cold-gas spraying, spin coating, plasma spraying, dip coating and manual coating.

* * * * *

UNITED STATES PATENT AND TRADEMARK OFFICE
CERTIFICATE OF CORRECTION

PATENT NO. : 8,279,402 B2  Page 1 of 1
APPLICATION NO. : 12/403132
DATED : October 2, 2012
INVENTOR(S) : Stephan Six et al.

It is certified that error appears in the above-identified patent and that said Letters Patent is hereby corrected as shown below:

Cover Page, line 2,
Col. 2 (Other Publications), delete "H20" and insert --$H_2O$--

Column 12,
Line 39, after "according" insert --to--

Signed and Sealed this
Fourth Day of December, 2012

David J. Kappos
*Director of the United States Patent and Trademark Office*